(12) United States Patent
Na et al.

(10) Patent No.: US 11,968,775 B2
(45) Date of Patent: Apr. 23, 2024

(54) PRINTED CIRCUIT BOARD AND DISPLAY DEVICE INCLUDING THE SAME

(71) Applicant: Samsung Display Co., Ltd., Yongin-Si (KR)

(72) Inventors: Yeon Sun Na, Yongin-si (KR); Min Soo Choi, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 0 days.

(21) Appl. No.: 17/326,267

(22) Filed: May 20, 2021

(65) Prior Publication Data

US 2022/0151058 A1 May 12, 2022

(30) Foreign Application Priority Data

Nov. 6, 2020 (KR) .................. 10-2020-0148084

(51) Int. Cl.
*H05K 1/02* (2006.01)
*H01L 25/18* (2023.01)
*H05K 1/14* (2006.01)
*H05K 1/18* (2006.01)

(52) U.S. Cl.
CPC ........... *H05K 1/0245* (2013.01); *H01L 25/18* (2013.01); *H05K 1/0225* (2013.01); *H05K 1/148* (2013.01); *H05K 1/189* (2013.01); *H05K 2201/049* (2013.01); *H05K 2201/0723* (2013.01); *H05K 2201/09727* (2013.01); *H05K 2201/10128* (2013.01)

(58) Field of Classification Search
CPC ..... H05K 1/0237–0253; H05K 1/0225; H05K 1/148; H05K 1/189; H05K 2201/09681; H05K 2201/049; H05K 2201/0723; H05K 2201/09727; H05K 2201/10128; H05K 1/0224

See application file for complete search history.

(56) References Cited

U.S. PATENT DOCUMENTS

| | | | | |
|---|---|---|---|---|
| 4,680,557 | A * | 7/1987 | Compton | H05K 1/0253 174/117 FF |
| 5,003,273 | A * | 3/1991 | Oppenberg | H05K 1/0219 174/117 FF |
| 6,765,298 | B2 * | 7/2004 | Chin | H05K 1/025 257/E23.173 |
| 7,755,445 | B2 | 7/2010 | Dutta et al. | |
| 9,161,431 | B2 * | 10/2015 | Frosch | H05K 1/0298 |
| 2001/0010271 | A1 * | 8/2001 | Lin | H05K 1/0224 174/268 |
| 2002/0126951 | A1 * | 9/2002 | Sutherland | H05K 1/0253 385/24 |
| 2006/0237322 | A1 * | 10/2006 | Hsu | H05K 1/0253 205/125 |
| 2017/0092663 | A1 * | 3/2017 | Chung | H05K 1/148 |
| 2017/0149111 | A1 * | 5/2017 | Yosui | H05K 1/14 |

* cited by examiner

*Primary Examiner* — Roshn K Varghese
(74) *Attorney, Agent, or Firm* — Innovation Counsel LLP

(57) ABSTRACT

An embodiment of a printed circuit board includes a first insulating layer, a metal layer disposed above the first insulating layer, a second insulating layer disposed above the metal layer, and signal lines disposed above the second insulating layer, the signal lines extending in a first direction and having line widths in a second direction perpendicular to the first direction. The metal layer has open areas overlapping the signal lines in a third direction perpendicular to the first and second directions. In another embodiment, the open areas are replaced with metal meshes.

15 Claims, 11 Drawing Sheets

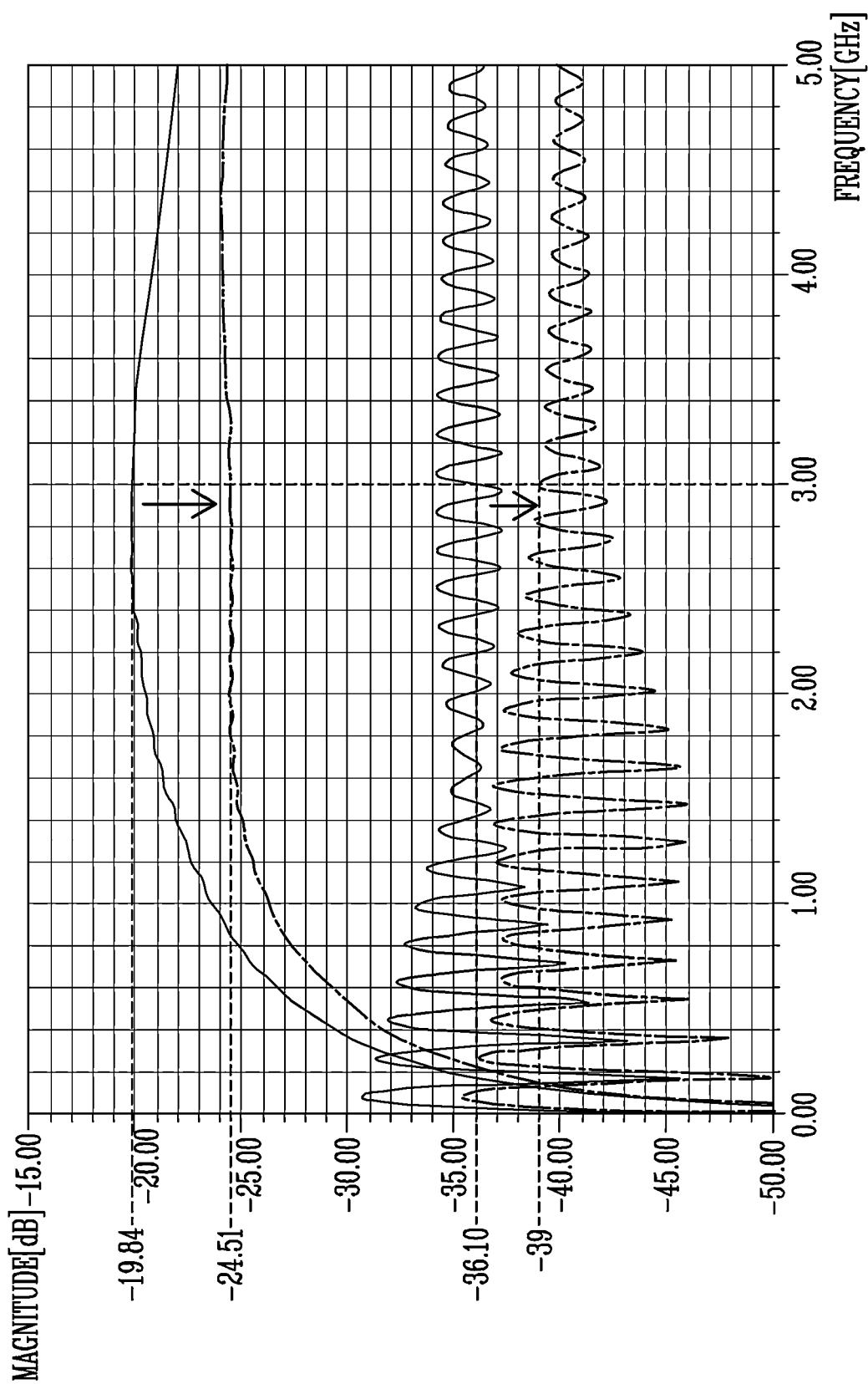

PRINTED CIRCUIT BOARD AND DISPLAY DEVICE INCLUDING THE SAME

CROSS-REFERENCE TO RELATED APPLICATION

The application claims priority to and the benefit of Korean Patent Application No. 10-2020-0148084, filed Nov. 6, 2020, the disclosure of which is hereby incorporated by reference for all purposes as if fully set forth herein in its entirety.

BACKGROUND

1. Field

The present disclosure relates to a printed circuit board and a display device including the same.

2. Discussion

With the development of information technology, the importance of display devices as connecting medium between users and information is emerging. In this regard, the use of display devices such as liquid crystal display devices and an organic light emitting display devices is increasing.

A display device may include pixels connected to scan lines and data lines, a scan driver for driving the scan lines, a data driver for driving data lines, and a timing controller for supplying a scan signal and a data signal to the scan driver and the data driver.

The scan driver, the data driver, and the timing controller may be implemented as semiconductor elements. In order to transmit and receive signals between semiconductor elements, a printed circuit board having a microstrip line structure in which signal lines are formed on one surface of an insulating layer and a strip line structure in which signal lines are formed inside the insulating layer may be used.

In recent years, as the performance of digital products becomes higher, the frequencies of signals transmitted between semiconductor elements are increasing. In order to transmit high-frequency signals, a printed circuit board having a microstrip line structure having a relatively high transmission rate is mainly used.

SUMMARY

A printed circuit board according to an embodiment of the present invention includes: a first insulating layer; a metal layer disposed above the first insulating layer; a second insulating layer disposed above the first metal layer; and signal lines disposed above the second insulating layer, the signal lines extending in a first direction and having line widths in a second direction perpendicular to the first direction, wherein the first metal layer has open areas overlapping the signal lines in a third direction perpendicular to the first and second directions.

The signal lines may include a differential pair of the signal lines.

The signal lines may include first and second signal line. The line widths of the first and second signal lines may be equal and center lines of the first and second signal lines may be parallel.

The line width of each of the first and second signal lines may be a shortest distance from a side to an opposite side of each of the first and second signal lines in the second direction.

The printed circuit board may include additional signal lines disposed above the second insulating layer. The additional signal lines may have narrower line widths than the line widths of the signal lines. The metal layer under the additional signal lines may be continuous. A pair of the signal lines may have a first mutual capacitance. A pair of the additional signal lines may have a second mutual capacitance. The pair of additional signal lines and the metal layer may have a third mutual capacitance. According to an embodiment, the second mutual capacitance is less than the first mutual capacitance and the first mutual capacitance is less than a sum of the second and third mutual capacitances. According to an embodiment, the line width of each of the pair of signal lines may equal a separation distance between the pair of the signal lines.

In an embodiment, the open area below a first signal line may extend to the open area below a second signal line.

In an embodiment, the circuit board may include a second metal layer disposed below the first insulating layer, a third insulating layer disposed below the second metal layer, a third metal layer disposed below the third insulating layer, and a fourth insulating layer disposed below the third metal layer.

A printed circuit board according to an embodiment may include the first insulating layer, the metal layer, the second insulating layer, the signal lines, and metal meshes within the metal layer. The metal meshes may have mesh holes overlapping the signal lines in a third direction perpendicular to the first and second directions.

A display device according to an embodiment of the present invention includes: a display panel including pixels; a plurality of source drivers connected to the display panel; and a printed circuit board connected to the plurality of source drivers and mounted with a timing controller for providing control signals and image data to the plurality of source drivers through signal lines.

The printed circuit board may include: a first insulating layer; a metal layer disposed above the first insulating layer; a second insulating layer disposed above the metal layer; and signal lines disposed above the second insulating layer, the signal lines extending in a first direction and having a line width in a second direction perpendicular to the first direction. The metal layer may have open areas overlapping the signal lines in a third direction perpendicular to the first and second directions.

The signal lines may include a differential pair of signal lines.

The first unit signal lines may include first and second signal lines, and the line widths of the first and second signal lines may be equal, and center lines of the first and second signal lines may be parallel.

The line width of each of the first and second signal lines may be a shortest distance from a side to an opposite side of each of the first and second signal lines in the second direction.

The printed circuit board may include additional signal lines disposed above the second insulating layer. The additional signal lines may have narrower line widths than the line widths of the signal lines. The metal layer under the additional signal lines may be continuous. A pair of the signal lines may have a first mutual capacitance. A pair of the additional signal lines may have a second mutual capacitance. The pair of additional signal lines and the metal layer may have a third mutual capacitance. According to an embodiment, the second mutual capacitance is less than the first mutual capacitance and the first mutual capacitance is less than a sum of the second and third mutual capacitances.

The display panel and the printed circuit board may be connected by a flexible film on which the plurality of source drivers are mounted, and the flexible film may be provided by a chip on film (COF) technique or a chip on plastic (COP) technique.

BRIEF DESCRIPTION OF THE DRAWINGS

FIG. 8B is a graph showing the degrees of near-end crosstalk and far-end crosstalk for each frequency.

DETAILED DESCRIPTION OF THE ILLUSTRATED EMBODIMENTS

Figure 1:
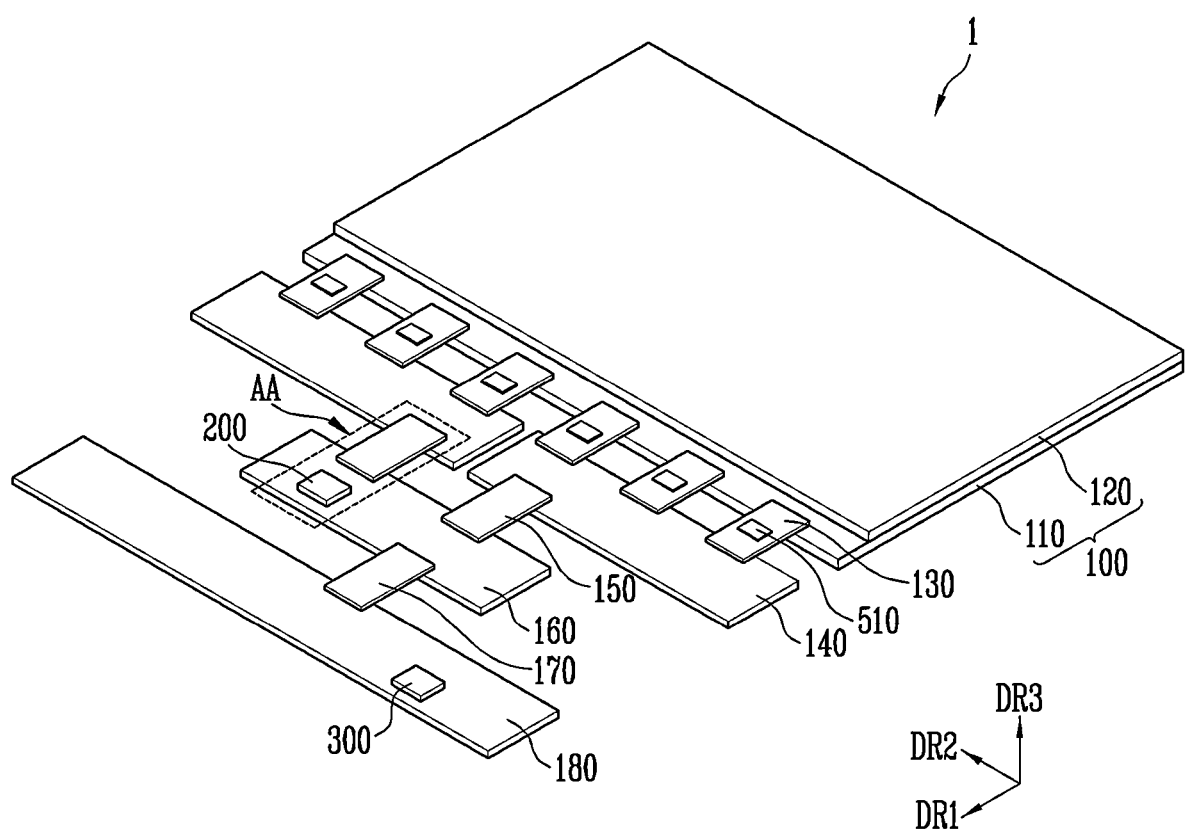
FIG. 1 is a perspective view of a display device according to the present invention.

Hereinafter, preferred embodiments of the present invention will be described in more detail with reference to the accompanying drawings. The same elements in the drawings are denoted by the same reference numerals, and redundant descriptions thereof are omitted.

Figure 2:
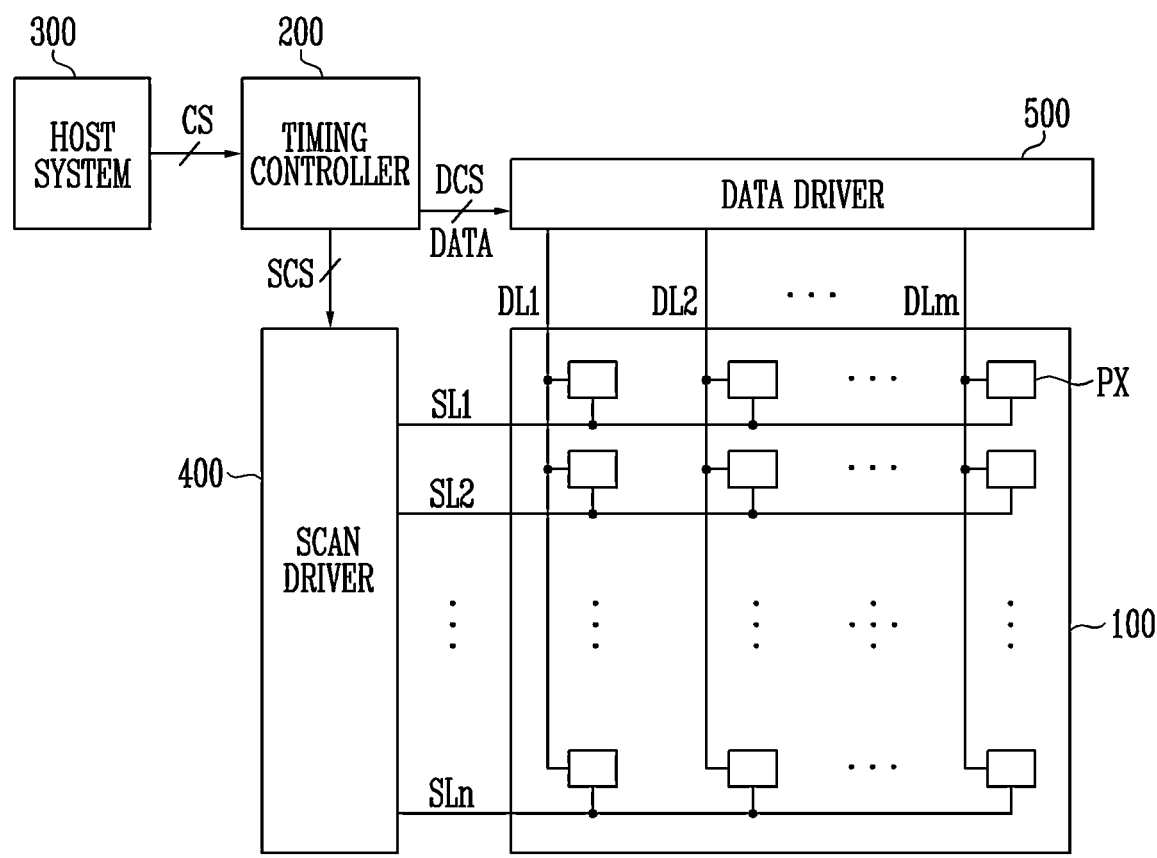
FIG. 2 is a block diagram of a display device according to the present invention.

FIG. 1 is a perspective view of a display device according to the present invention. FIG. 2 is a block diagram of the display device according to the present invention.

Referring to FIGS. 1 and 2, a display device 1 may include a display panel 100, a scan driver 400, a data driver 500, a flexible film 130, a first printed circuit board (PCB) 140, a first connection part 150, a second PCB 160, a second connection part 170, a third PCB 180, a timing controller (T-con) 200, and a host system 300. Hereinafter, for convenience of description, the display device 1 is an organic light emitting display device 1. However, the present invention is not limited thereto, and may be applied to various types of display devices, such as a liquid crystal display device (LCD), an electrophoretic display (EPD), and an inorganic light emitting display device.

The display panel 100 may include a lower substrate 110 and an upper substrate 120. The lower substrate 110 may be a thin film transistor substrate including plastic or glass. The upper substrate 120 may be an encapsulation substrate including a plastic film, a glass substrate, or a protective film.

The lower substrate 110 may include a display area and a non-display area provided around the display area. The display area is an area in which pixels PX are provided to display an image. Scan lines SL1 to SLn (where n is a positive integer of 2 or more) and data lines DL1 to DLm (where m is a positive integer of 2 or more) may be disposed on the lower substrate 110. The data lines DL1 to DLm may be disposed to intersect with the scan lines SL1 to SLn.

The scan driver 400 may receive a scan control signal SCS from the timing controller 200. The scan driver 400 may supply scan signals to the scan lines SL1 to SLn according to the scan control signal SCS. The scan signals may include a scan signal and a sensing signal. The scan driver 400 may be formed in the non-display area outside one or both sides of the display area of the display panel 100 in a gate driver in panel (GIP) scheme.

The data driver 500 may receive image data DATA and a data control signal DCS from the timing controller 200. According to an embodiment, the image data DATA may be image data received from the host system 300, or image data corrected by performing external compensation for compensating a threshold voltage of a driving transistor and after-image compensation for compensating the degree of deterioration of a light emitting element. The data driver 500 may convert the image data DATA into an analog data voltage according to the data control signal DCS and supply the analog data voltage to the data lines DL1 to DLm. Pixels PX to which data voltages are to be supplied may be selected by the scan signals supplied from the scan driver 400. The selected pixels PX may receive data voltages and emit light with a predetermined brightness.

The data driver 500 may include a plurality of source driver integrated circuits (SDICs) 510. Each of the SDICs 510 may be mounted on each of the flexible films 130. Each of the flexible films 130 may be bonded to pads provided on the lower substrate 110 by a tape automated bonding (TAB) technique using an anisotropic conductive film (ACF). Since the pads are connected to the data lines DL1 to DLm, the SDICs 510 may be connected to the data lines DL1 to DLm.

Each of the flexible films 130 may be provided by a chip on film (COF) technique or a chip on plastic (COP) technique. The chip on film may include a base film such as polyimide and a plurality of conductive signal lines provided on the base film. Each of the flexible films 130 may be foldable or bendable.

The SDICs 510 may be connected to each other by the first PCBs 140. The flexible films 130 may connect the first PCBs 140 to the lower substrate 110 of the display panel 100. The first PCB 140 may be a flexible PCB (FPCB).

The timing controller 200 may be mounted on the second PCB 160. The second PCB 160 may be connected to the first PCB 140 through the first connection part 150.

The first connection part 150 may connect the second PCB 160 to the first PCB 140. The first connection part 150 may be a plurality of signal lines including a bus, which is an input/output terminal to which an intra interface is applied between the timing controller 200 and the SDIC 510. The intra interface is an interface capable of processing a plurality of input data at high speed. However, the present invention is not limited thereto, and the first connection part 150 may be implemented as a plurality of signal lines including an arbitrary input/output terminal and an arbitrary interface capable of transmitting data.

The third PCB 180 may be connected to the second PCB 160 through the second connection part 170. The third PCB 180 may supply power supply voltages and driving signals to the display device 1. The host system 300 may be mounted on the third PCB 180.

The timing controller 200 may receive image data DATA and control signals CS from the host system 300. The host system 300 may include a system on chip (SoC) in which a scaler is embedded. The host system 300 may convert the image data DATA input from the outside into a format suitable for display on the display panel 100.

The control signals CS may include a vertical synchronization signal, a horizontal synchronization signal, a data enable signal, a dot clock, and the like. The vertical synchronization signal is a signal defining one frame period. The horizontal synchronization signal is a signal defining one horizontal period required to supply data voltages to pixels PX of one horizontal line of the display panel 100. The data enable signal is a signal defining a period in which valid data is input. The dot clock is a signal that is repeated in a predetermined short period.

In order to control the operation timing of the scan driver 400 and the data driver 500, the timing controller 200 may generate the scan control signal SCS for controlling the operation timing of the scan driver 400 and the data control signal DCS for controlling the operation timing of the data driver 500, based on the control signals CS. The timing controller 200 may output the scan control signal SCS to the scan driver 400 and may output the data control signal DCS to the data driver 500.

Figure 3:
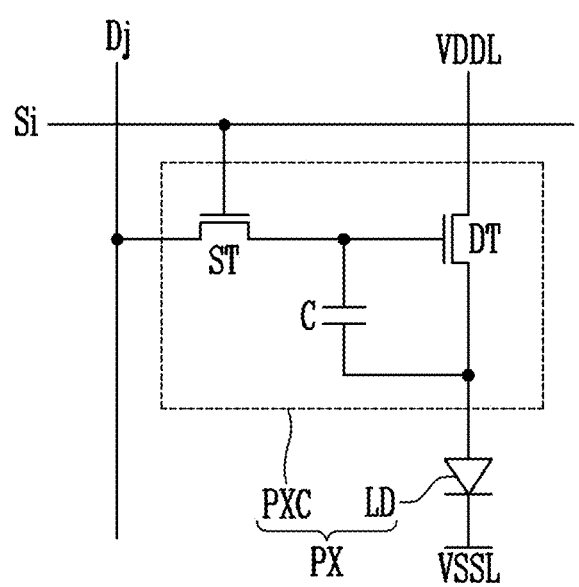
FIG. 3 is a circuit diagram illustrating an example of a pixel of FIG. 2.

FIG. 3 is a circuit diagram illustrating an example of the pixel of FIG. 2. In FIG. 3, for convenience of description, a pixel PX connected to an i-th scan line Si (i is a positive integer satisfying 1≤i≤n), a j-th data line Dj (j is a positive integer satisfying 1≤j≤m), and a first power supply voltage line VDDL is illustrated.

Referring to FIG. 3, the pixel PX may include a light emitting element LD and a pixel circuit PXC for supplying a driving current to the light emitting element LD. The pixel circuit PXC may include a driving transistor DT, a switch transistor ST, and a capacitor C.

The light emitting element LD may emit light according to a current flowing through the driving transistor DT. An anode electrode of the light emitting element LD may be connected to a source electrode of the driving transistor DT, and a cathode electrode of the light emitting element LD may be connected to a second power supply voltage line VSSL to which a low potential driving voltage lower than the driving voltage is supplied.

The light emitting element LD according to an embodiment may include an anode electrode, a hole transporting layer, an organic light emitting layer, an electron transporting layer, and a cathode electrode. In the light emitting element LD, when a voltage is applied to the anode electrode and the cathode electrode, holes and electrons may move to the organic light emitting layer through the hole transporting layer and the electron transporting layer, respectively, and may recombine with each other in the organic light emitting layer to emit light.

The gate electrode of the driving transistor DT may be connected to the first electrode of the switch transistor ST, the source electrode of the driving transistor DT may be connected to the anode electrode of the light emitting element LD, and the drain electrode of the driving transistor DT may be connected to the first power supply voltage line VDDL to which the driving voltage is supplied. The driving transistor DT may control the current flowing from the first power supply voltage line VDDL to the light emitting element LD according to a voltage difference between the gate electrode and the source electrode.

The gate electrode of the switch transistor ST may be connected to the i-th scan line Si, the first electrode of the switch transistor ST may be connected to the gate electrode of the driving transistor DT, and the second electrode may be connected to the j-th data line Dj. When the i-th scan signal of the gate-on voltage is supplied to the i-th scan line Si, the switch transistor ST may be turned on to supply the voltage of the j-th data line Dj to the gate electrode of the driving transistor DT.

In FIG. 3, the first electrode of the switch transistor ST may be a source electrode or a drain electrode, and the second electrode of the switch transistor ST may be an electrode different from the first electrode. For example, when the first electrode is a source electrode, the second electrode may be a drain electrode.

The capacitor C may include a first electrode connected to the gate electrode of the driving transistor DT and a second electrode connected to the source electrode of the driving transistor DT. The capacitor C may store a voltage difference between the gate electrode and the source electrode of the driving transistor DT.

It should be noted that a case in which the driving transistor DT and the switch transistor ST are formed as N-type metal oxide semiconductor field effect transistors (MOSFETs) has been mainly described with reference to FIG. 3, but the present invention is not limited thereto. The driving transistor DT and the switch transistor ST may be formed as P-type MOSFETs.

The structure of the pixel circuit PXC in the embodiment of the present invention is not limited by FIG. 3. For example, the pixel circuit PXC may further include a sensing line for receiving the current generated by the driving transistor DT and a transistor disposed between one electrode (or source electrode) of the driving transistor DT and the sensing line.

Figure 4:
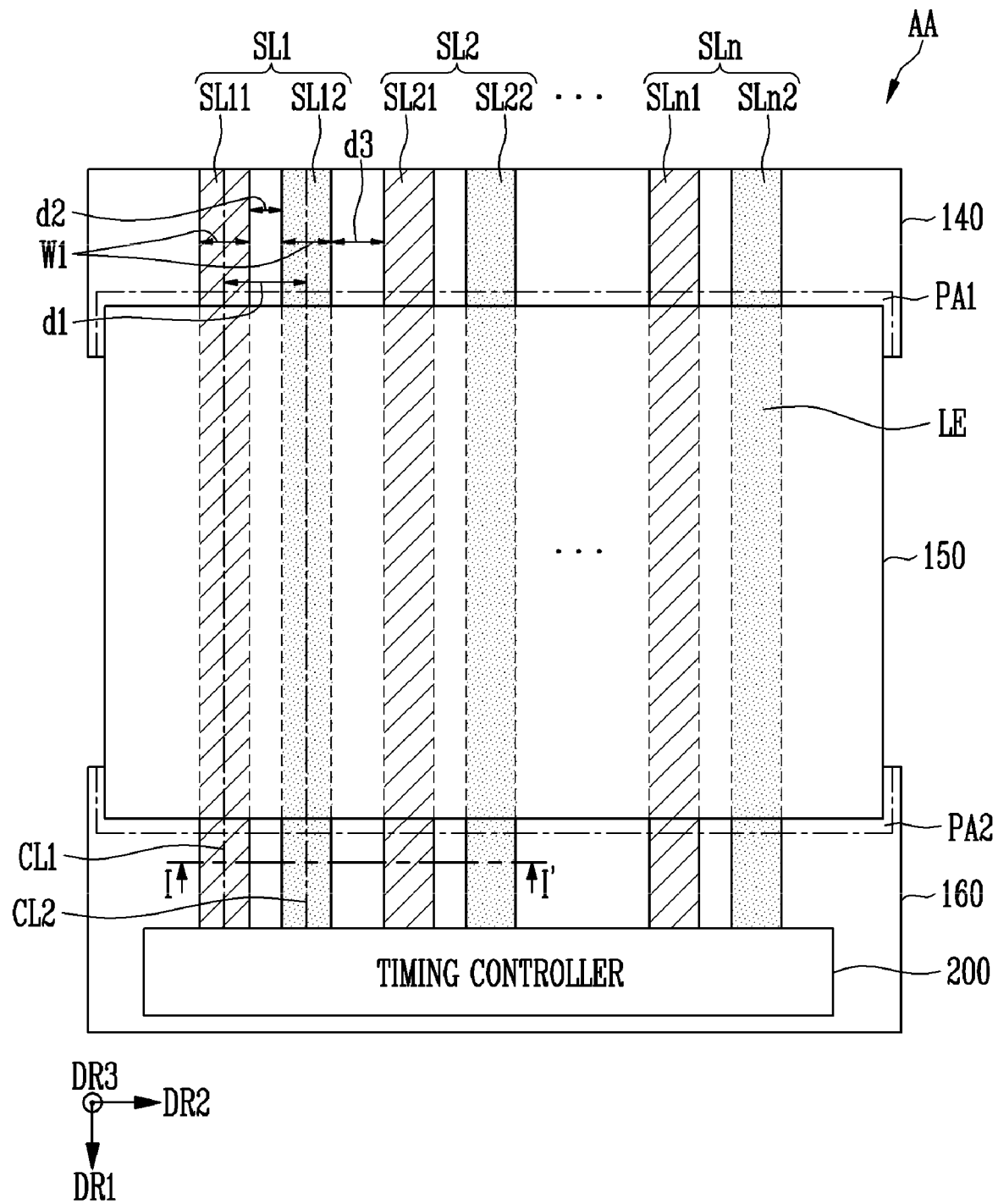
FIG. 4 is an enlarged plan view of an area AA of FIG. 1.

FIG. 4 is an enlarged plan view of an area AA of FIG. 1.

Referring to FIG. 4, the first PCB 140 and the second PCB 160 may be connected by the first connection part 150. According to an embodiment, a plurality of unit signal lines SL1, SL2, . . . , SLn provided on each of the first PCB 140 and the second PCB 160 may be connected to each other by a plurality of lead wires LE provided in the first connection part 150. The first PCB 140 may include a first pad area PA1, and the lead wires LE may be directly connected to the upper surfaces of the unit signal lines SL1, SL2, . . . , SLn in the first pad area PAL The second PCB 160 may include a second pad area PA2, and the lead wires LE may be directly connected to the upper surfaces of the unit signal lines SL1, SL2, . . . , SLn in the second pad area PA2. For example, the lead wirings LE may be ultrasonically bonded to the unit signal lines SL1, SL2, . . . , SLn.

The timing controller 200 mounted on the second PCB 160 may be connected to the plurality of unit signal lines SL1, SL2, . . . , SLn. The timing controller 200 may be electrically connected to the SDIC 510 (see FIG. 1) by the plurality of unit signal lines SL1, SL2, . . . , SLn and the lead wires LE. For convenience of description, FIG. 4 illustrates that all of the unit signal lines SL1, SL2, . . . , SLn connected to the timing controller 200 are connected to only one of the two first connection parts 150, but it should be understood that some of the unit signal lines SL1, SL2, . . . , SLn are connected to the other of the two first connection parts 150.

According to an embodiment, the plurality of unit signal lines SL1, SL2, . . . , SLn may generally extend in a first direction DR1 and may be arranged side by side in a second direction DR2 perpendicular to the first direction DR1. However, the plurality of unit signal lines SL1, SL2, . . . , SLn may have a fan-out structure in an area adjacent to the timing controller 200.

Each of the unit signal lines SL1, SL2, . . . SLn may include a first signal lines SL11, SL21, . . . , SLn1 and second signal lines SL12, SL22, . . . , SLn2. According to an embodiment, a line width W1 of the first signal lines SL11, SL21, ..., SLn1 and the line width W1 of the second signal lines SL12, SL22, ..., SLn2 may be substantially equal to each other. The line width W1 of each of the first signal lines SL11, SL21, ..., SLn1 and the second signal lines SL12, SL22, ..., SLn2 may be the shortest distance from one side to the other side of each of the first signal lines SL11, SL21, ..., SLn1 and the second signal lines SL12, SL22, ..., SLn2 in the second direction DR2.

In addition, according to an embodiment, the distance d1 between the center line CL1 of the first signal lines SL11, SL21, ..., SLn1 and the center line CL2 of the second signal lines SL12, SL22, ..., SLn2 may be constant. For example, the distance d1 between the center line CL1 of the first signal lines SL11, SL21, ..., SLn1 and the center line CL2 of the second signal lines SL12, SL22, ..., SLn2 may be equal regardless of the change in the line width W1 of the first signal lines SL11, SL21, ..., SLn1 and the line width W1 of the second signal lines SL12, SL22, ..., SLn2.

The first signal lines SL11, SL21, ..., SLn1 and the second signal lines SL12, SL22, ..., SLn2 may form a differential pair. Therefore, even when the AC current transmitted to the first signal lines SL11, SL21, ..., SLn1, which are one unit line, by noise, the second signal lines SL12, SL22, ..., SLn2, which are the other unit line, compensate and change this, thereby improving the quality of the transmitted signal.

In recent years, the display device 1 needs to process signals at higher speed due to a trend toward high quality and large area. However, in a case in which the signals flowing through the unit signal lines SL1, SL2, ..., SLn are an AC current, when the frequency increases, the current density is concentrated around the outer circumferences of the unit signal lines SL1, SL2, ..., SLn. At this time, the effective area of the unit signal lines SL1, SL2, ..., SLn may be reduced, and thus the skin effect that increases transmission loss may occur. This is a phenomenon that the AC current density decreases toward the center of the unit signal lines SL1, SL2, ..., SLn and the current is concentrated outside the unit signal lines SL1, SL2, ..., SLn. As the frequency increases, the penetration depth of the current may decrease.

In order to reduce the skin effect, a method of increasing the line width W1 of the first signal lines SL11, SL21, ..., SLn1 and the second signal lines SL12, SL22, ..., SLn2 may be considered.

When the line width W1 of the first signal lines SL11, SL21, ..., SLn1 and the second signal lines SL12, SL22, ..., SLn2 increases, the distance d2 between the first signal lines SL11, SL21, ..., SLn1 and the second signal lines SL12, SL22, ..., SLn2 is reduced. Thus, the capacitance between the first signal lines SL11, SL21, ..., SLn1 and the second signal lines SL12, SL22, ..., SLn2 increases. As a result, the impedance of the transmission line (i.e., the unit signal lines SL1 to SLn and the lead wire LE) may decrease. In this case, the impedance is a type of resistance value according to frequency. In order to transmit a signal without loss, the input impedance generated from the transmission line and the output impedance of the display panel 100 have to match each other. This is referred to as impedance matching. For example, the input impedance to the transmission line of the display device 1 may be 100 Ω. Therefore, in order to maintain the impedance of the transmission line, it is necessary to lower the capacitance between the first signal lines SL11, SL21, ..., SLn1 and the second signal lines SL12, SL22, ..., SLn2 by increasing the distance d2 between the first signal lines SL11, SL21, ..., SLn1 and the second signal lines SL12, SL22, ..., SLn2.

When the distance d2 between the first signal lines SL11, SL21, ..., SLn1 and the second signal lines SL12, SL22, ..., SLn2 increases, the distance d3 between the first unit signal line SL1 and the second unit signal line SL2 may be reduced. In this case, the coupling capacitance formed between the first unit signal line SL1 and the second unit signal line SL2 arranged in parallel may increase, thus causing a crosstalk phenomenon. When the crosstalk between the first unit signal line SL1 and the second unit signal line SL2 increases, the near-end crosstalk and the far-end crosstalk may increase, resulting in a decrease in signal integrity. Therefore, in order to maintain the signal integrity of the transmission line, it is necessary to increase the distance d3 between the first unit signal line SL1 and the second unit signal line SL2.

The method of increasing the distance d2 between the first signal lines SL11, SL21, ..., SLn1 and the second signal lines SL12, SL22, ..., SLn2, and the distance d3 between the first unit signal line SL1 and the second unit signal line SL2 has a limitation because the first PCB 140, the first connection part 150, and the second PCB 160 has a limited space in a plan view. Hereinafter, the method of solving the planar space limitation will be described with reference to FIG. 5.

Figure 5:
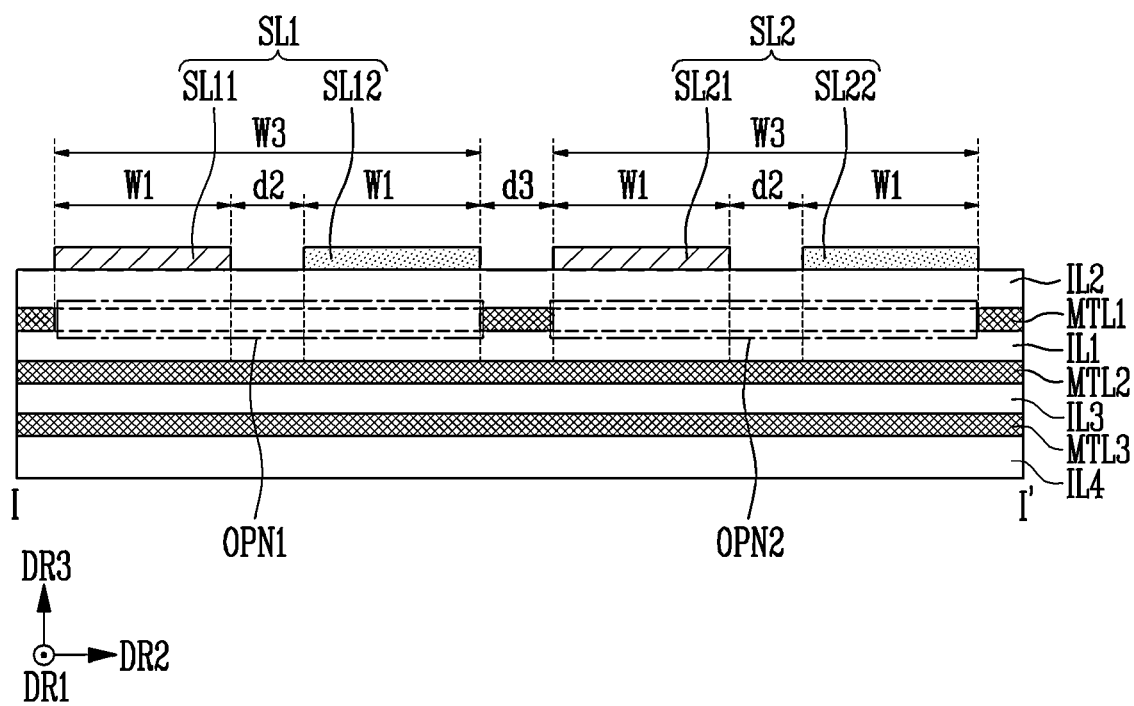
FIGS. 5 and 6 are cross-sectional views taken along line I-I' of FIG. 4 according to various embodiments.
Figure 6:
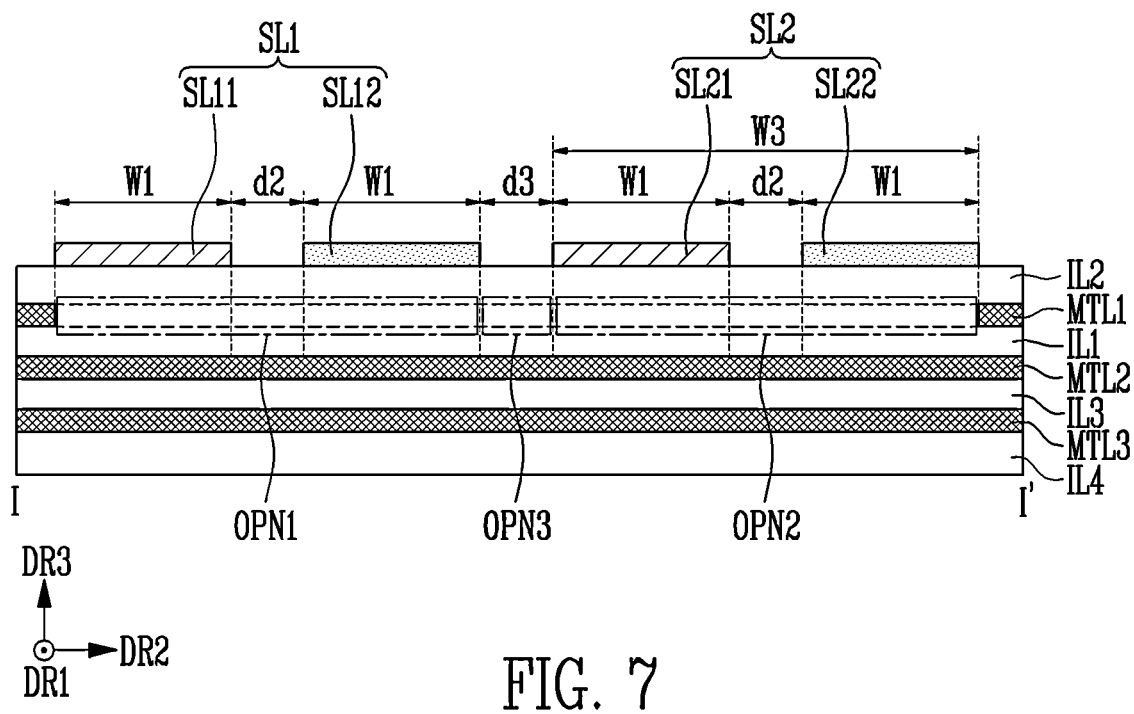

FIGS. 5 and 6 are cross-sectional views taken along line I-I' of FIG. 4 according to various embodiments. For convenience of description, the second PCB 160 will be described as an example, but this may also be applied to the first PCB 140, the first connection part 150, the second connection part 170, and the third PCB 180.

Referring to FIG. 5, the second PCB 160 may include a first metal layer MTL1, a second metal layer MTL2, a third metal layer MTL3, a first insulating layer IL1, a second insulating layer IL2, a third insulating layer IL3, a fourth insulating layer IL4, a first unit signal line SL1, and a second unit signal line SL2.

According to an embodiment of the present invention, the second PCB 160 may include a first insulating layer IL1, a first metal layer MTL1 disposed on one surface of the first insulating layer IL1, a second insulating layer IL2 disposed on one surface of the first metal layer MTL1, and signal lines SL11, SL12, SL21, and SL22 disposed on one surface of the second insulating layer IL2.

According to an embodiment of the present invention, the second PCB 160 may further include a second metal layer MTL2 disposed on the other surface of the first insulating layer IL1, a third insulating layer IL3 disposed on one surface of the second metal layer MTL2, a third metal layer MTL3 disposed on one surface of the third insulating layer IL3, and a fourth insulating layer IL4 disposed on one side of the third metal layer MTL3.

In this case, the first to third metal layers MTL1, MTL2, and MTL3 may be used as one of a signal layer, a ground layer, and a power supply layer. For example, when one of the first to third metal layers MTL1, MTL2, and MTL3 is used as the signal layer, a pattern for a signal line may be formed, when used as the ground layer, a ground voltage may be supplied, and when used as the power layer, necessary power may be supplied to an element connected to the signal line.

The first metal layer MTL1 may include a first opening OPN1 in an area overlapping the first unit signal line SL1 in the third direction DR3. The first opening OPN1 may overlap not only the first signal line SL11 and the second signal line SL12 of the first unit signal line SL1 but also the area therebetween in the third direction DR3. That is, the width W3 of the first opening OPN1 in the second direction DR2 may be substantially equal to the sum of the line width W1 of the first signal line SL11, the line width W1 of the second signal line SL12, and the distance d2 between the first signal line SL11 and the second signal line SL12.

Likewise, the first metal layer MTL1 may include a second opening OPN2 in an area overlapping the second unit signal line SL2 in the third direction DR3. The second opening OPN2 may overlap not only the first signal line SL21 and the second signal line SL22 of the second unit signal line SL1 but also the area therebetween in the third direction DR3. That is, the width W3 of the second opening OPN2 in the second direction DR2 may be substantially equal to the sum of the line width W1 of the first signal line SL21, the line width W1 of the second signal line SL22, and the distance d2 between the first signal line SL21 and the second signal line SL22.

When the first opening OPN1 and the second opening OPN2 are formed in the first metal layer MTL1, the capacitance between the first and second unit signal lines SL1 and SL2 and the first metal layer MTL1 in the third direction DR3 may not occur. Therefore, it is possible to reduce the influence of the capacitance between the first signal line SL11 and the second signal line SL12, which is increased due to an increase in the line width W1 of the first signal line SL11 of the first unit signal line SL1 and the line width W2 of the second signal line SL12 of the first unit signal line SL1. As a result, this limits the deleterious effect of the impedance reduction of the transmission line. Since the second unit signal line SL2 is also the same as the first unit signal line SL1, a redundant description thereof will be omitted.

The distance d3 between the first unit signal line SL1 and the second unit signal line SL2 may be designed to correspond to the line width W1 of each of the first signal lines SL11 and SL21 and the second signal lines SL12 and SL22. For example, the distance d3 between the first unit signal line SL1 and the second unit signal line SL2 may be designed to increase in proportion to the increase of the line width W1 of each of the first signal lines SL11 and SL21 and the second signal lines SL12 and SL22. In this case, the distance d3 between the first unit signal line SL1 and the second unit signal line SL2 may increase within the planar space limitation of the first PCB 140, the first connection part 150, and the second PCB 160.

As such, since the distance d3 between the first unit signal line SL1 and the second unit signal line SL2 increases, the coupling capacitance formed between the first unit signal line SL1 and the second unit signal line SL2 is reduced. Therefore, a crosstalk phenomenon may be reduced.

In the first metal layer MTL1, an opening may not be formed in an area overlapping the area between the first unit signal line SL1 and the second unit signal line SL2 in the third direction DR3. However, the present invention is not limited thereto, and as illustrated in FIG. 6, the first metal layer MTL1 may further include a third opening OPN3 in an area overlapping the area between the first unit signal line SL1 and the second unit signal line SL2 in the third direction DR3. When the first metal layer MTL1 further includes the third opening OPN3, it may be expected that the capacitance generated between the first and second unit signal lines SL1 and SL2 adjacent to the first metal layer MTL1 in the third direction DR3 is further reduced.

Figure 7:
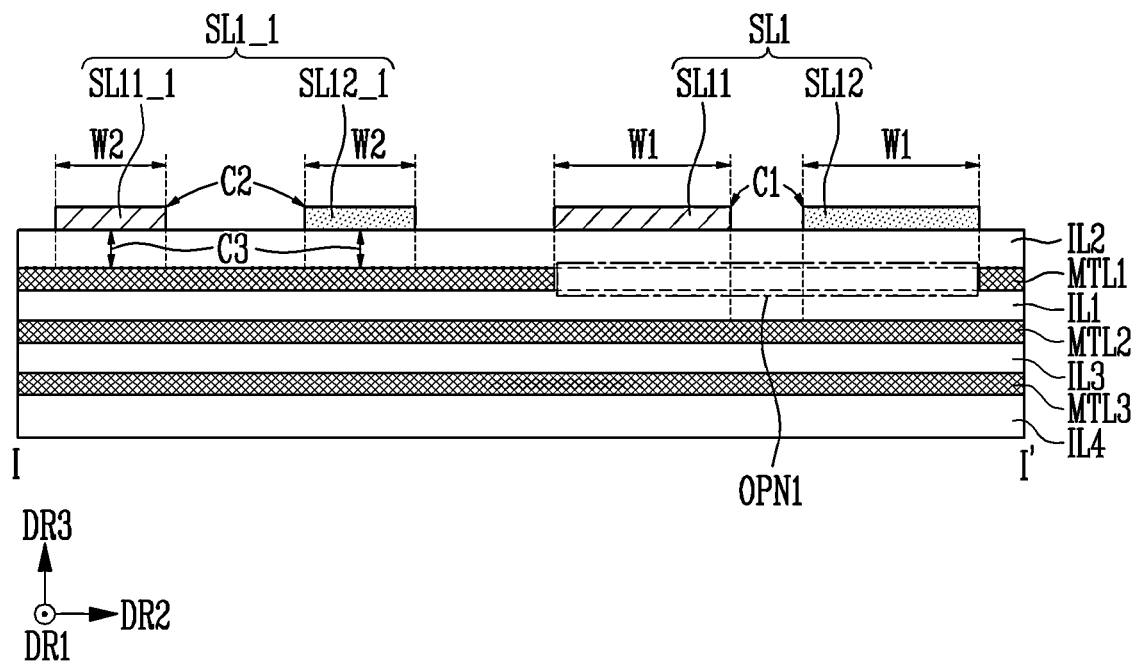
FIG. 7 is a cross-sectional view for describing a line width design of a unit signal line.

FIG. 7 is a cross-sectional view for describing the line width design of the unit signal line.

FIG. 7 illustrates an embodiment in which no openings are formed in the first metal layer MTL1, compared to the embodiment of the present invention in which the first opening OPN1 is formed in the first metal layer MTL1.

Equation 1 below may be satisfied on the assumption that the line width of each of a first signal line SL11 and a second signal line SL12 of the first unit signal line SL1 is a first width W1 when the first opening OPN1 is formed in the first metal layer MTL1, and the maximum allowable line width of a first signal line SL11_1 and a second signal line SL12_1 of a (1_1)-th unit signal line SL1_1 is a second width W2 when an opening is not formed in the first metal layer MTL1. That is, the line width W1 of each of the first signal line SL11 and the second signal line SL12 of the first unit signal line SL1 when the first opening OPN1 is formed in the first metal layer MTL1 may be greater than the maximum allowable line width W2 of the first signal line SL11_1 and the second signal line SL12_1 of the (1_1)-th unit signal line SL1_1 when an opening is not formed in the first metal layer MTL1:

Equation 1

$$W1 > W2.$$

According to an embodiment of the present invention, when the first opening OPN1 is formed in the first metal layer MTL1 and the line width of each of the first signal line SL11 and the second signal line SL12 is the first width W1, when the capacitance between the first signal line SL11 and the second signal line SL12 is the first capacitance C1, an opening is not formed in the first metal layer MTL1, and the line width of each of the first signal line SL11_1 and the second signal line SL12_1 is the second width W2, when the capacitance between the first signal line SL11_1 and the second signal line SL12_1 is the second capacitance C2, an opening is not formed in the first metal layer MTL1, and the line width of each of the first signal line SL11_1 and the second signal line SL12_1 is the second width W2, and when the capacitance between the first and second signal lines SL11_1 and SL12_1 and the first metal layer MTL1 is the third capacitance C3, the relationship between the first to third capacitances C1, C2, and C3 may satisfy Equation 2 below:

Equation 2

$$C2 < C1 \leq C2 + C3.$$

That is, the first capacitance C1 may be greater than the second capacitance C2 and less than or equal to the sum of the second capacitance C2 and the third capacitance C3. In other words, the line width W1 of each of the first signal line SL11 and the second signal line SL12 when the first opening OPN1 is formed in the first metal layer MTL1 may be designed so that the first capacitance C1 is greater than the second capacitance C2 between the first signal line SL11_1 and the second signal line SL12_1 when an opening is not formed in the first metal layer MTL1. In addition, the line width W1 of each of the first signal line SL11 and the second signal line SL12 when the first opening OPN1 is formed in the first metal layer MTL1 may be designed so that the first capacitance C1 is less than or equal to the sum of the second capacitance C2 and the third capacitance C3 removed due to the formation of the first opening OPN1 in the first metal layer MTL1.

Figure 8A:
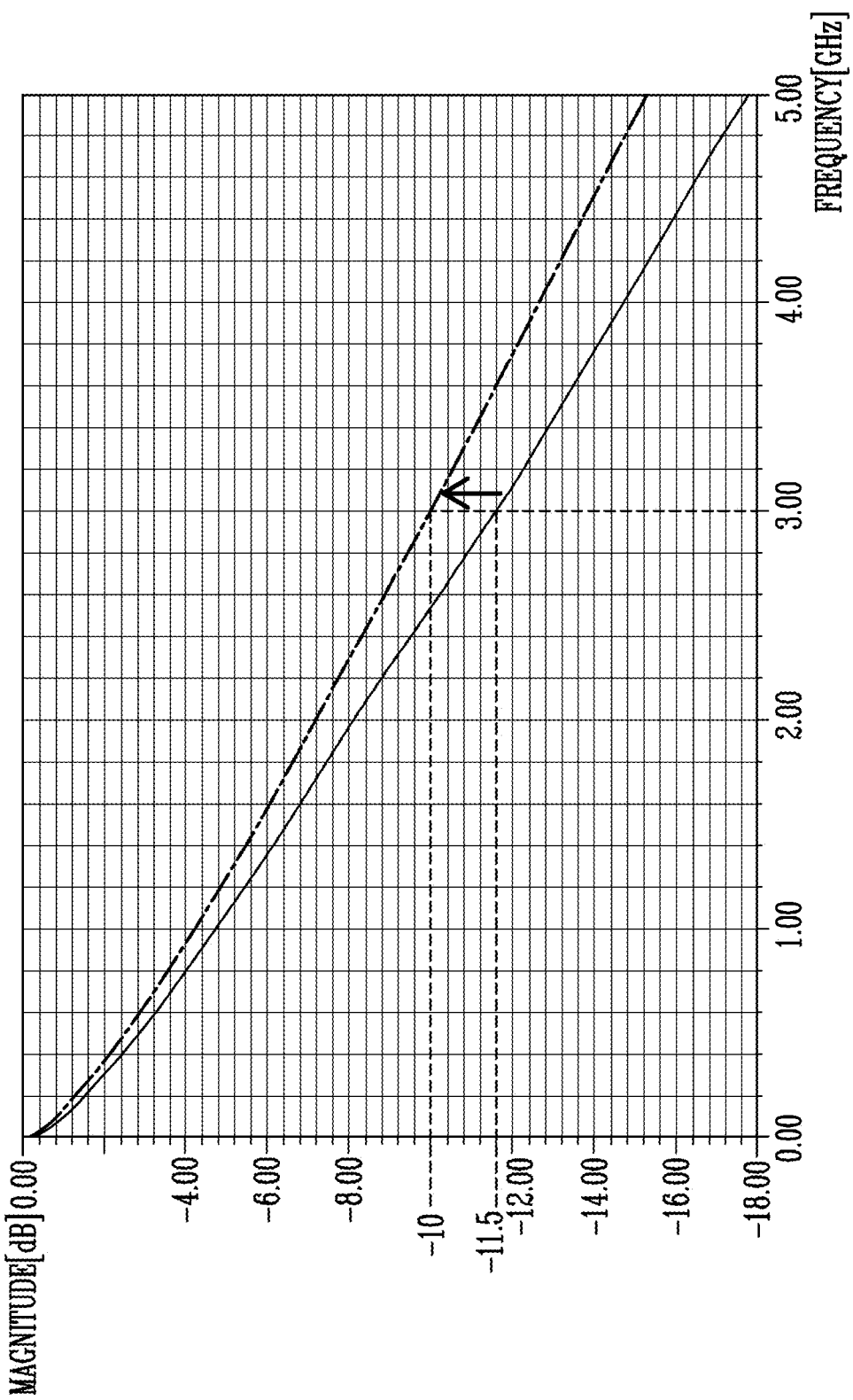
FIG. 8A is a graph showing transmission coefficient for each frequency.
Figure 9A:
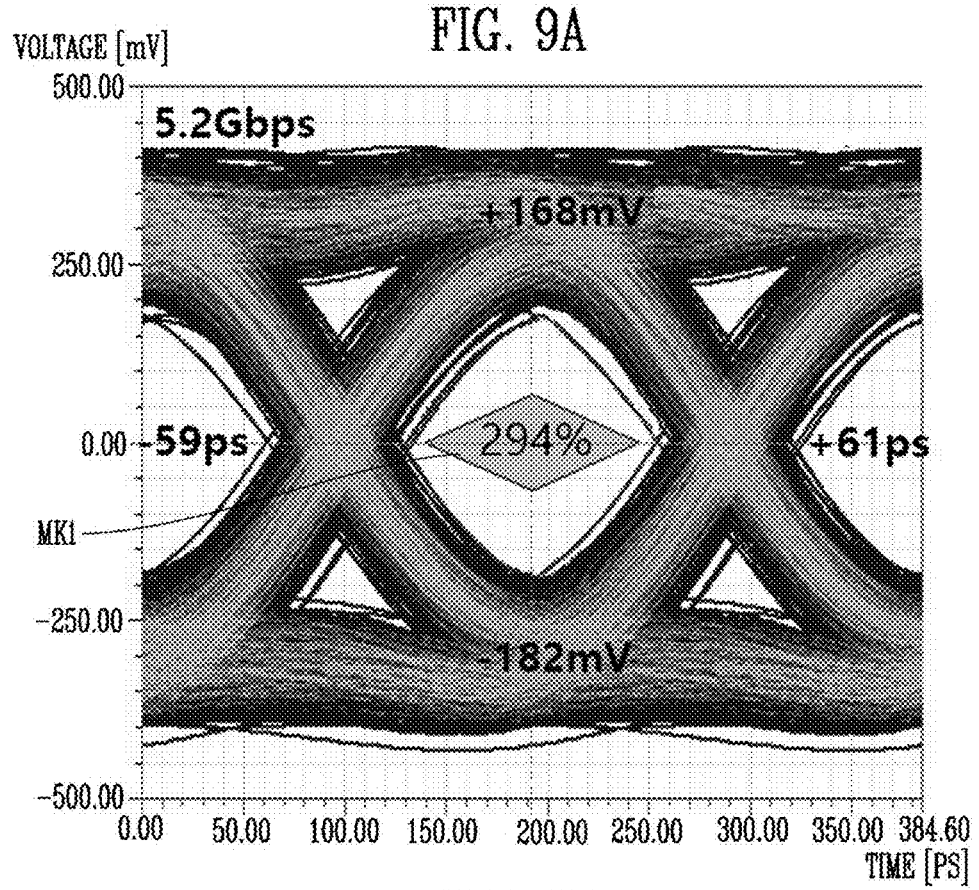
FIGS. 9A and 9B are eye diagrams for describing a change according to whether a first metal layer includes an opening.
Figure 9B:
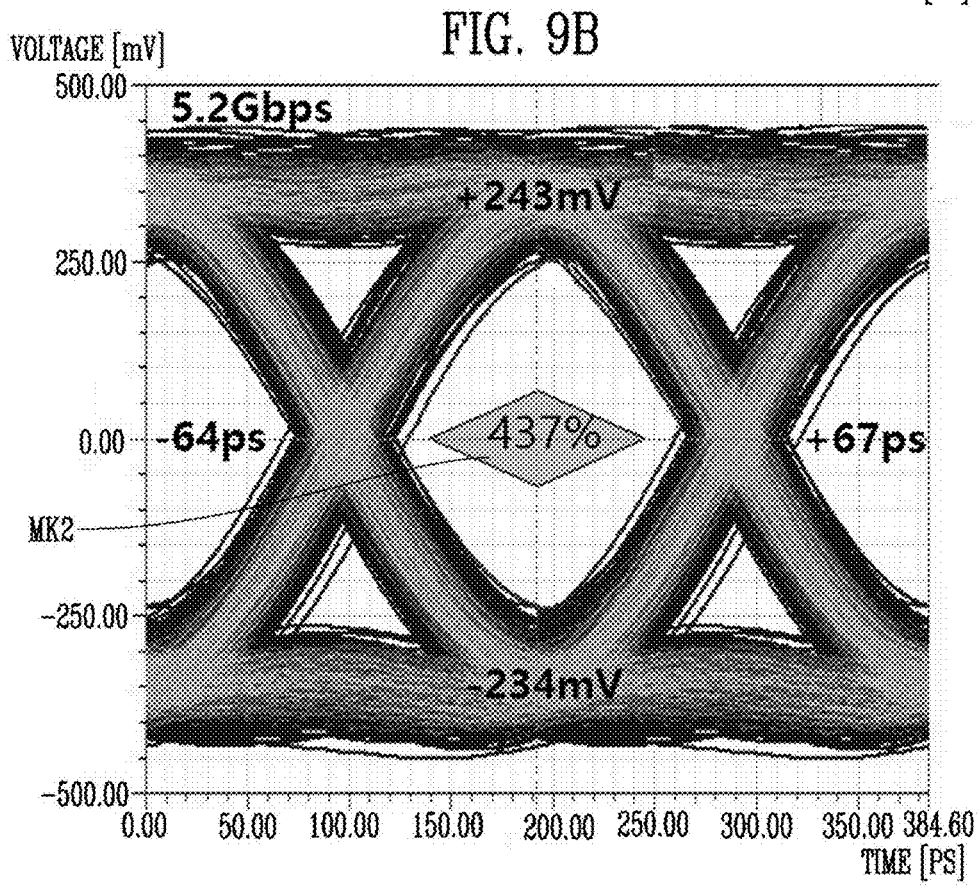

FIG. 8A is a graph showing transmission coefficient for each frequency, and FIG. 8B is a graph showing the degrees of near-end crosstalk and far-end crosstalk for each frequency. FIGS. 9A and 9B are eye diagrams for describing a change according to whether the first metal layer includes the opening. In this case, a graph indicated by a solid line represents a case in which an opening is not formed in the first metal layer MTL1, and a graph indicated by a dashed-dotted line represents a case in which the first opening OPN1 is formed in the first metal layer MTL1.

Referring to FIGS. 7 and 8A, in both the case in which the opening is not formed in the first metal layer MTL1 and the case in which the first opening OPN1 is formed in the first metal layer MTL1, the transmission coefficient generally decreases due to the skin effect when the frequency increases. In this case, the transmission coefficient defines an output value with respect to an input. As the transmission coefficient increases, the output value with respect to the input is larger.

However, in the embodiment in which the first opening OPN1 is formed in the first metal layer MTL1, the transmission coefficient tends to increase compared to the case in which the opening is not formed in the first metal layer MTL1. For example, in the case in which the frequency is 3 [GHz], the transmission coefficient when the opening is not formed in the first metal layer MTL1 is −11.5 [dB], and the transmission coefficient when the first opening OPN1 is formed in the first metal layer MTL1 is −10 [dB]. That is, when the first opening OPN1 is formed in the first metal layer MTL1 according to the embodiment of the present invention, the transmission coefficient is increased by 1.5 [dB].

Referring to FIGS. 5, 7, and 8B, in both the case in which the opening is not formed in the first metal layer MTL1 and the case in which the first opening OPN1 is formed in the first metal layer MTL1, the near-end crosstalk and the far-end crosstalk vibrate and rise up to a certain frequency, and then converge to a specific value when the near-end crosstalk and the far-end crosstalk exceed a certain frequency. The crosstalk refers to interference between the first unit signal line SL1 and the second unit signal line SL2. As the crosstalk is smaller, it means that the signal integrity is better.

However, in the embodiment in which the first opening OPN1 is formed in the first metal layer MTL1, the near-end crosstalk and the far-end crosstalk tend to decrease compared to the case in which the opening is not formed in the first metal layer MTL1. For example, in the case in which the frequency is 3 [GHz], the near-end crosstalk when the opening is not formed in the first metal layer MTL1 is −36.10 [dB], and the near-end crosstalk when the first opening OPN1 is formed in the first metal layer MTL1 is −39.00 [dB]. That is, when the first opening OPN1 is formed in the first metal layer MTL1 according to the embodiment of the present invention, the near-end crosstalk is decreased by about 3 [dB]. For example, in the case in which the frequency is 3 [GHz], the far-end crosstalk when the opening is not formed in the first metal layer MTL1 is −19.84 [dB], and the far-end crosstalk when the first opening OPN1 is formed in the first metal layer MTL1 is −24.51 [dB]. That is, when the first opening OPN1 is formed in the first metal layer MTL1 according to the embodiment of the present invention, the far-end crosstalk is decreased by about 4.7 [dB].

Referring to FIGS. 7, 9A, and 9B, the area of a second mask MK2 when the first opening OPN1 is formed in the first metal layer MTL1 may be greater than the area of a first mask MK1 when the opening is not formed in the first metal layer MTL1. In this case, the eye diagram is a waveform showing the level movement flow of the signal by superimposing it on one screen within a specific time unit. Since the overlapping waveform of the signal resembles a human eye, it is called an eye diagram, and the vertically and horizontally opened portion where the signal at the center does not cross is called eye opening. As the noise of the signal is increased, the size of the eye opening is reduced. In contrast, as the noise of the signal is smaller and thus the signal integrity is better, the size of the eye opening is increased. A horizontal axis of the eye diagram represents time, and a vertical axis of the eye diagram represents voltage. In the center of the eye diagram, rhombic masks MK1 and MK2 are disposed. The masks MK1 and MK2 mean the allowable value of the noise of the signal. When the waveform of the eye diagram contacts the masks MK1 and MK2, it means that the signal deviates from the allowable value of the noise.

For example, in the case in which the frequency of the signal is 5.2 [GHz], the relative size of the first mask MK1 when the opening is not formed in the first metal layer MTL1 is 294 [%], and the relative size of the second mask MK2 when the first opening OPN1 is formed in the first metal layer MTL1 is 437 [%]. That is, when the first opening OPN1 was formed in the first metal layer MTL1, the eye margin was improved by about 1.5 times compared to the case in which the opening is not formed in the first metal layer MTL1.

Hereinafter, other embodiments will be described. In the following embodiments, descriptions of the same elements as those of the previously described embodiments will be omitted or simplified, and differences will be mainly described.

Figure 10:
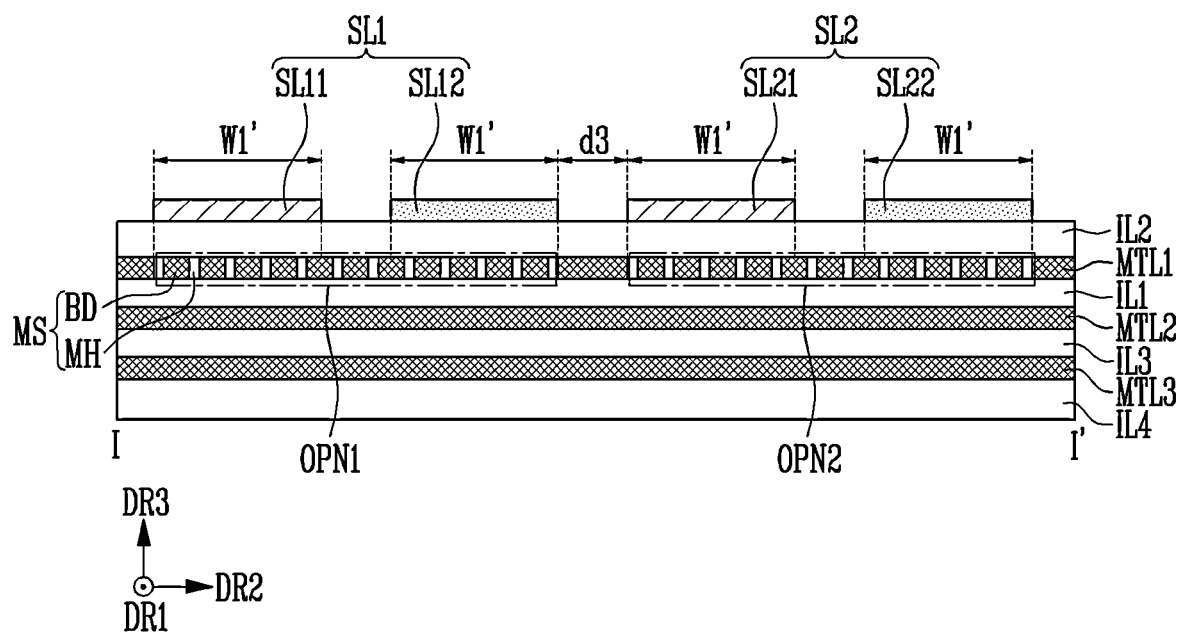
FIGS. 10 and 11 are cross-sectional views taken along line I-I' of FIG. 4 according to other embodiments.
Figure 11:
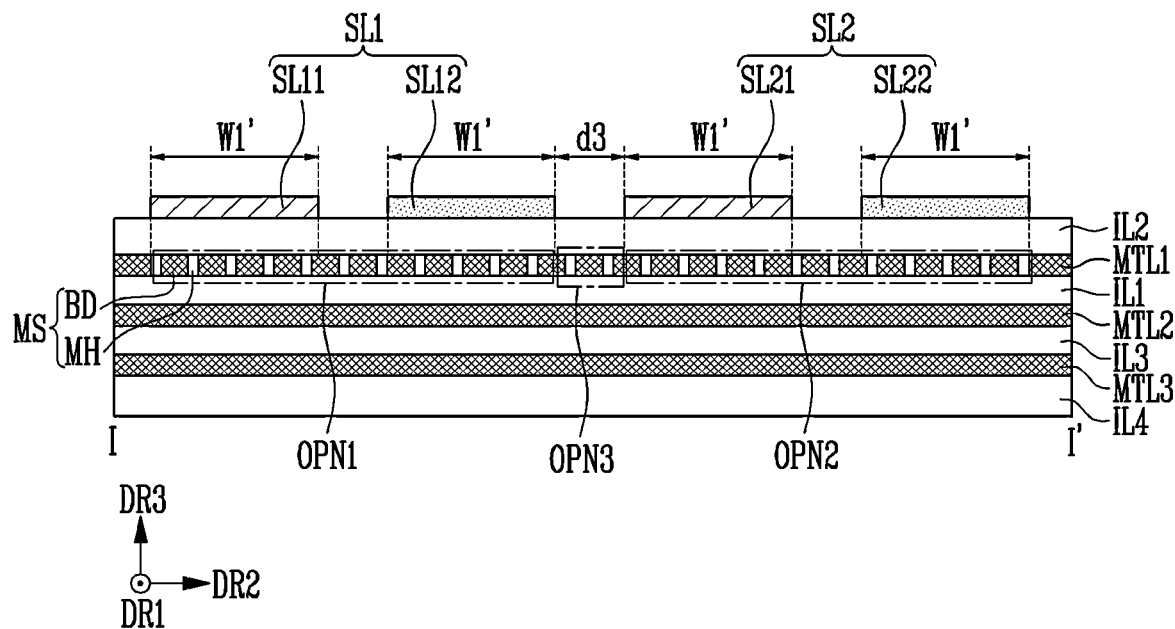
Figure 12:
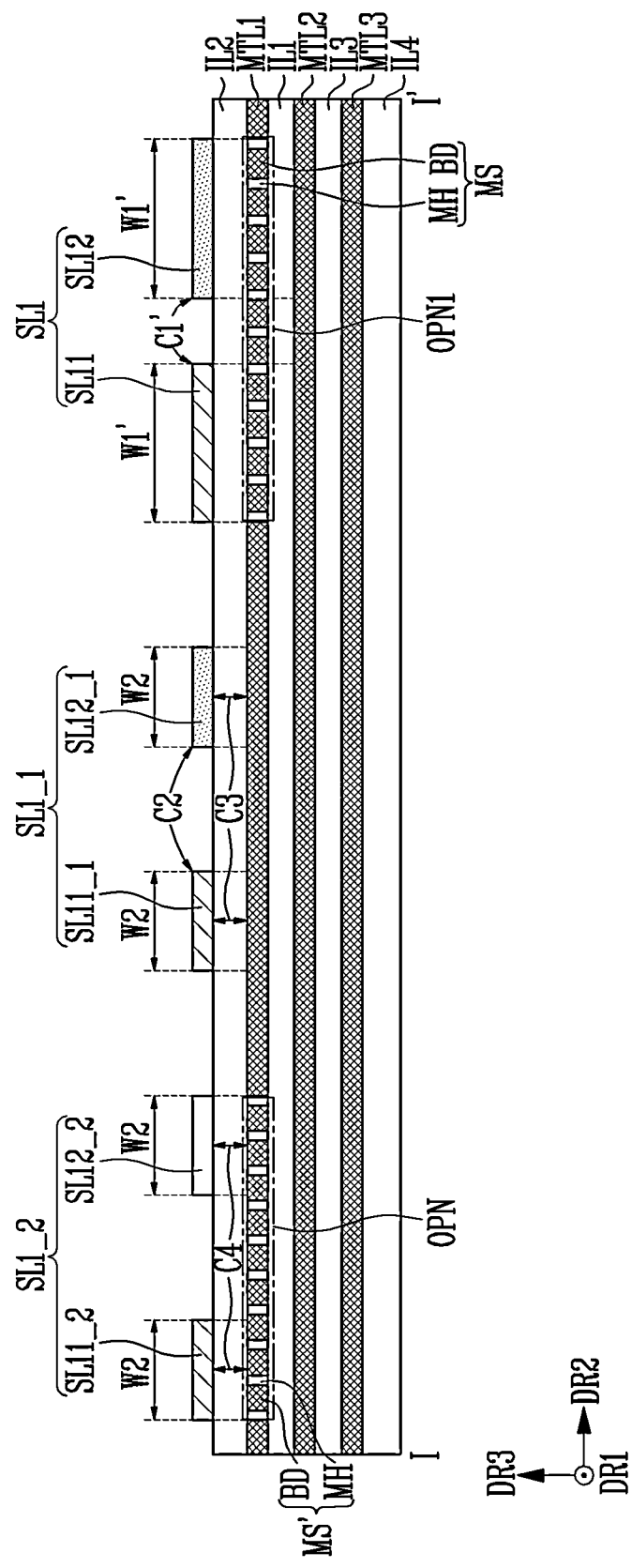
FIG. 12 is a cross-sectional view for describing a line width design of a unit signal line according to another embodiment.

FIGS. 10 and 11 are cross-sectional views taken along line I-I' of FIG. 4 according to other embodiments. For convenience of description, the second PCB 160 will be described as an example, but this may also be applied to the first PCB 140, the first connection part 150, the second connection part 170, and the third PCB 180. FIG. 12 is a cross-sectional view for describing a line width design of a unit signal line according to another embodiment.

The embodiments illustrated in FIGS. 10 and 11 differ from the embodiments illustrated in FIGS. 5 and 6, in that a metal layer MS having a mesh structure is included in an opening area of a first metal layer MTL1. Hereinafter, the metal layer MS having the mesh structure will be described, and a description of the substantially same configuration will be omitted.

As illustrated in FIG. 10, the first metal layer MTL1 may include a metal layer MS having a mesh structure in a first opening (OPN1) area and a second opening (OPN2) area. The metal layer MS having the mesh structure may include a body BD and a mesh hole MH.

As illustrated in FIG. 11, the first metal layer MTL1 may include a metal layer MS having a mesh structure in a first opening (OPN1) area, a second opening (OPN2) area, and a third opening (OPN3) area. The metal layer MS having the mesh structure may include a body BD and a mesh hole MH.

As such, when the metal layer MS having the mesh structure is included in the first to third opening (OPN1, OPN2, and OPN3) areas, signal lines may also be patterned in the first to third opening (OPN1, OPN2, and OPN3) areas. Thus, when designing various signal lines patterned in the first metal layer MTL1, it is possible to expect an effect of reducing restrictions.

However, since the metal layer having the mesh structure overlapping the first unit signal line SL1 in the third direction DR3 is included, it is necessary to consider the metal layer MS having the mesh structure when designing the line widths W1' of the first signal line SL11 and the second signal line SL12.

FIG. 12 illustrates an embodiment in which no opening is formed in the first metal layer MTL1 and an embodiment in which the metal layer MS having the mesh structure is formed in the opening (OPN) area of the first metal layer MTL1, compared to the embodiment of the present invention in which the metal layer MS having the mesh structure is formed in the first opening (OPN1) area of the first metal layer MTL1.

Equation 1 above may be satisfied on the assumption that the line width of each of a first signal line SL11 and a second signal line SL12 of a first unit signal line SL1 is a first width W1' when the metal layer MS having the mesh structure is formed in the first opening OPN1, and the maximum allowable line width of a first signal line SL11_1 and a second signal line SL12_1 of a (1_1)-th unit signal line SL1_1 is a second width W2 when an opening is not formed in the first metal layer MTL1. That is, the line width W1' of each of the first signal line SL11 and the second signal line SL12 of the first unit signal line SL1 when the metal layer MS having the mesh structure is formed in the first opening OPN1 of the first metal layer MTL1 may be greater than the maximum allowable line width W2 of the first signal line SL11_1 and the second signal line SL12_1 of the (1_1)-th unit signal line SL1_1 when an opening is not formed in the first metal layer MTL1.

According to an embodiment of the present invention, when the metal layer MS having the mesh structure is formed in the first opening OPN1 of the first metal layer MTL1 and the line width of each of the first signal line SL11 and the second signal line SL12 is the first width W1', when the capacitance between the first signal line SL11 and the second signal line SL12 is the first capacitance C1, an opening is not formed in the first metal layer MTL1, and the line width of each of the first signal line SL11_1 and the second signal line SL12_1 is the second width W2, when the capacitance between the first signal line SL11_1 and the second signal line SL12_1 is the second capacitance C2, an opening is not formed in the first metal layer MTL1, and the line width of each of the first signal line SL11_1 and the second signal line SL12_1 is the second width W2, when the capacitance between the first and second signal lines SL11_1 and SL12_1 and the first metal layer MTL1 is the third capacitance C3, a metal layer MS' having a mesh structure is formed in the opening of the first metal layer MTL1, and the line width of each of the first signal line SL11_2 and the second signal line SL12_2 of the first unit signal line SL1_2 is the second width W2, and when the capacitance between the first signal line SL11_2 and the second signal line SL12_2 and the metal layer MS' having the mesh structure is the fourth capacitance C4, the relationship between the first to fourth capacitances C1', C2, C3, and C4 may satisfy Equation 3 below:

Equation 2

$$C2 < C1' \leq C2 + C3 - C4.$$

That is, the first capacitance C1' may be greater than the second capacitance C2, and may be less than or equal to the value obtained by subtracting the fourth capacitance C4 from the sum of the second capacitance C2 and the third capacitance C3. In other words, the line width W1' of each of the first signal line SL11 and the second signal line SL12 when the first opening OPN1 is formed in the first metal layer MTL1 may be designed to be greater than the second capacitance C2 between the first signal line SL11_1 and the second signal line SL12_1 when an opening is not formed in the first metal layer MTL1. The first capacitance C1' may be designed to be less than or equal to the value obtained by subtracting the fourth capacitance C4 between the first signal line SL11_2 and the second signal line SL12_2 and the metal layer MS' having the mesh structure from the sum of the second capacitance C2 and the third capacitance C3 removed due to the formation of the first opening OPN1 in the first metal layer MTL1. In conclusion, the line width W1' of the first signal line SL11 and the second signal line SL12 when the metal layer MS having the mesh structure is included in the opening area may be less than the line width W1 of the first signal line SL11 and the second signal line SL12 when the metal layer MS having the mesh structure is not included in the opening area.

In the printed circuit board according to embodiments of the present invention, the conducting wire line layer overlapping the signal line in the thickness direction is removed, thereby enabling high-speed signal transmission and improving signal integrity.

However, the effects of the present invention are not limited to the above-described effects, and may be variously extended without departing from the spirit and scope of the present invention.

While the present invention has been described with reference to embodiments, it will be understood by those of ordinary skill in the art that various modifications and changes can be made to the present invention without departing from the spirit and scope of the present invention described in the appended claims.

What is claimed is:
1. A printed circuit board assembly comprising:
a printed circuit board; and
a connection part connected to the printed circuit board, wherein each of the printed circuit board and the connection part includes:
a first insulating layer;
a first metal layer disposed above the first insulating layer;
a second insulating layer disposed above the first metal layer;
signal lines disposed above the second insulating layer, the signal lines extending in a first direction and having line widths in a second direction perpendicular to the first direction;
a second metal layer disposed below the first insulating layer;
a third insulating layer disposed below the second metal layer;
a third metal layer disposed below the third insulating layer; and
a fourth insulating layer disposed below the third metal layer,
wherein the first metal layer has open areas overlapping entire widths of the signal lines and areas between the signal lines in a third direction perpendicular to the first and second directions,
wherein the second insulating layer electrically isolates the first metal layer from the signal lines,
wherein the first insulating layer electrically isolates the first metal layer from the second metal layer,
wherein the third insulating layer electrically isolates the second metal layer from the third metal layer,
wherein the open areas extend along entire lengths of the signal lines in the first direction, and wherein the signal lines of the printed circuit board directly connect to the signal lines of the connection part.

2. The printed circuit board assembly of claim 1, wherein the signal lines include a differential pair of signal lines.

3. The printed circuit board assembly of claim 1, wherein the signal lines include first and second signal lines,
the line widths of the first and second signal lines are equal, and
center lines of the first and second signal lines are parallel.

4. The printed circuit board assembly of claim 3, wherein the line width of each of the first and second signal lines is a shortest distance from a side to an opposite side of each of the first and second signal lines in the second direction.

5. The printed circuit board assembly of claim 1, further comprising additional signal lines disposed above the second insulating layer, wherein
the additional signal lines have narrower line widths than the line widths of the signal lines, and
the metal layer under the additional signal lines is continuous.

6. The printed circuit board assembly of claim 5, wherein
a pair of the signal lines have a first mutual capacitance,
a pair of the additional signal lines have a second mutual capacitance,
the pair of the additional signal lines and the metal layer have a third mutual capacitance,
the second mutual capacitance is less than the first mutual capacitance, and
the first mutual capacitance is less than a sum of the second and third mutual capacitances.

7. The printed circuit board assembly of claim 6, wherein the line width of each of the pair of the signal lines equals a separation distance between the pair of the signal lines.

8. The printed circuit board assembly of claim 1, wherein the open area below a first signal line extends to the open area below a second signal line.

9. A display device comprising:
a display panel including pixels;
a plurality of source drivers connected to the display panel;
a printed circuit board connected to the plurality of source drivers and mounted with a timing controller for providing control signals and image data to the plurality of source drivers through signal lines; and
a connection part connected to the printed circuit board,
wherein each of the printed circuit board and the connection part includes:
a first insulating layer;
a first metal layer disposed above the first insulating layer;
a second insulating layer disposed above the first metal layer;
the signal lines disposed above the second insulating layer, the signal lines extending in a first direction and having line widths in a second direction perpendicular to the first direction;
a second metal layer disposed below the first insulating layer;
a third insulating layer disposed below the second metal layer;
a third metal layer disposed below the third insulating layer; and
a fourth insulating layer disposed below the third metal layer,
wherein the first metal layer has open areas overlapping entire widths of the signal lines and areas between the signal lines in a third direction perpendicular to the first and second directions,
wherein the second insulating layer electrically isolates the first metal layer from the signal lines,
wherein the first insulating layer electrically isolates the first metal layer from the second metal layer,
wherein the third insulating layer electrically isolates the second metal layer from the third metal layer, and
wherein the open areas extend along entire lengths of the signal lines in the first direction, and
wherein the signal lines of the printed circuit board directly connect to the signal lines of the connection part.

10. The display device of claim 9, wherein the signal lines include a differential pair of signal lines.

11. The display device of claim 9, wherein
the signal lines include first and second signal lines, and
the line widths of the first and second signal lines are equal, and
center lines of the first and second signal lines are parallel.

12. The display device of claim 11, wherein the line width of each of the first and second signal lines is a shortest distance from a side to an opposite side of each of the first and second signal lines in the second direction.

13. The display device of claim 9, further comprising additional signal lines disposed above the second insulating layer, wherein
the additional signal lines have narrower line widths than the line widths of the signal lines, and
the metal layer under the additional signal lines is continuous.

14. The display device of claim 13, wherein
a pair of the signal lines have a first mutual capacitance,
a pair of the additional signal lines have a second mutual capacitance,
the pair of the additional signal lines and the metal layer have a third mutual capacitance,
the second mutual capacitance is less than the first mutual capacitance, and
the first mutual capacitance is less than a sum of the second and third mutual capacitances.

15. The display device of claim 9, wherein the display panel and the printed circuit board are connected by a flexible film on which the plurality of source drivers are mounted, and
the flexible film is provided by a chip on film (COF) technique or a chip on plastic (COP) technique.

* * * * *